United States Patent [19]

Chiang

[11] 3,844,857

[45] Oct. 29, 1974

[54] AUTOMATIC PROCESS OF ETCHING COPPER CIRCUITS WITH AN AQUEOUS AMMONIACAL SOLUTION CONTAINING A SALT OF A CHLOROXY ACID

[75] Inventor: John Shu-Chi Chiang, Mercerville, N.J.

[73] Assignee: FMC Corporation, New York, N.Y.

[22] Filed: Oct. 30, 1972

[21] Appl. No.: 301,866

[52] U.S. Cl. .......................... 156/8, 156/3, 156/19, 156/345

[51] Int. Cl. .......................... C23f 1/02

[58] Field of Search .......... 156/3, 8, 18, 19, 7, 345; 252/79.5

[56] References Cited

UNITED STATES PATENTS

| | | | |
|---|---|---|---|
| 3,650,957 | 3/1972 | Shipley et al. | 252/79.1 |
| 3,650,958 | 3/1972 | Shipley | 252/79.1 |
| 3,650,959 | 3/1972 | Shipley et al. | 252/79.1 |
| 3,677,950 | 7/1972 | Alderuccio | 252/79.5 |
| 3,705,061 | 12/1972 | King | 156/19 |

*Primary Examiner*—William A. Powell
*Assistant Examiner*—Brian J. Leitten

[57] ABSTRACT

Copper circuits are etched with an ammoniacal aqueous solution of from about 0.4 mole/liter to limit of solubility of cupric amine chloride maintained at a pH of 8–12 with ammonia, buffered with an ammonium salt and activated by a soluble salt of a chloroxy acid such as sodium chlorite whose concentration does not exceed about 0.1 mole/liter wherein automatic feed valves maintain the pH and sodium chlorite concentration. The feed valves are operated by voltage sensitive relays. The output from a pH meter activates the relay for controlling ammonia feed while the EMF developed between a platinum and reference electrode immersed in the etchant, activates the relay for controlling sodium chlorite feed.

The etchant composition exhibits low undercutting thereby rendering it especially suitable for fine line circuits and circuits resisted with noble metals such as gold/nickel.

4 Claims, 1 Drawing Figure

PATENTED OCT 29 1974
3,844,857
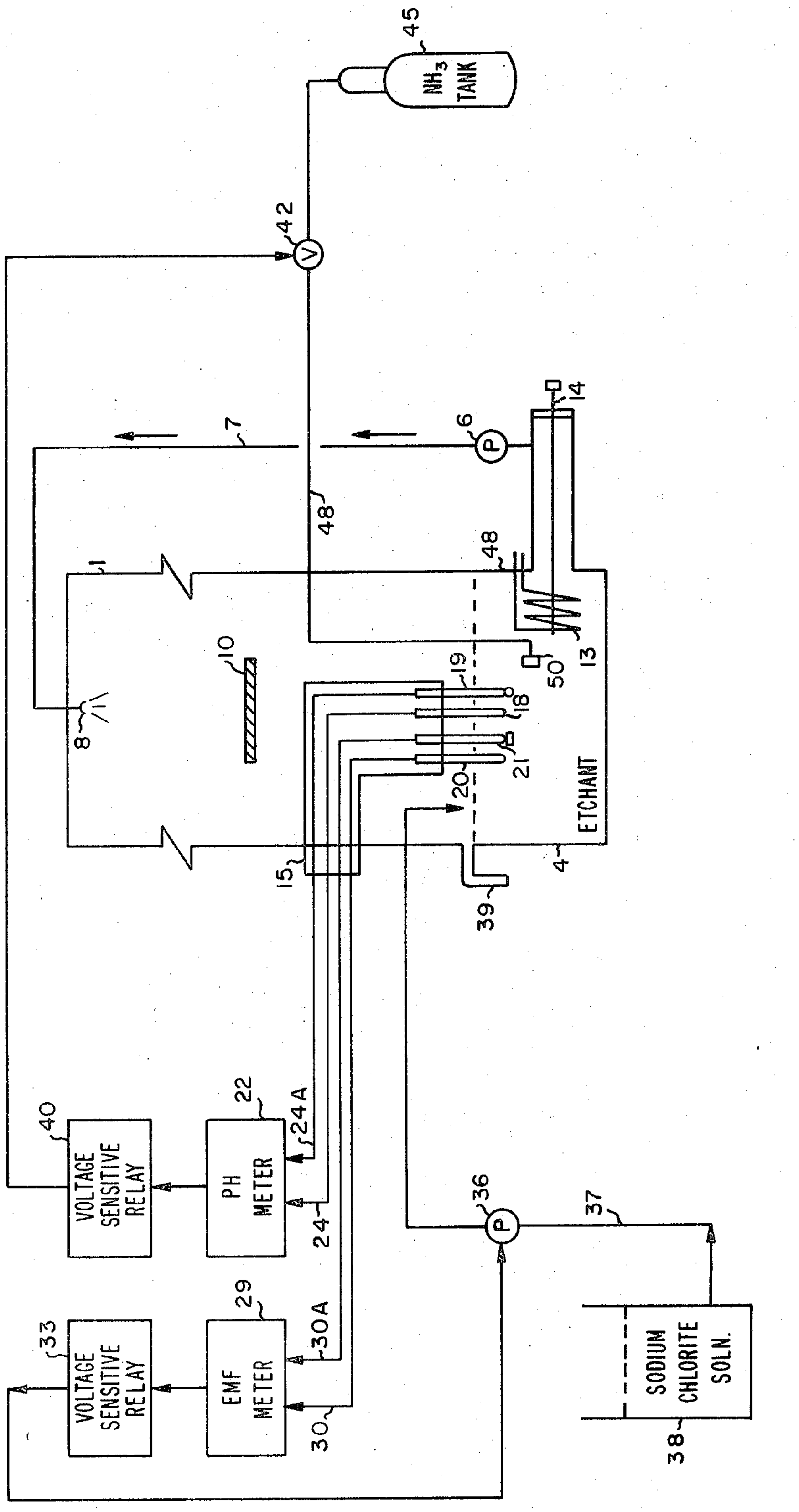

AUTOMATIC PROCESS OF ETCHING COPPER CIRCUITS WITH AN AQUEOUS AMMONIACAL SOLUTION CONTAINING A SALT OF A CHLOROXY ACID

This invention relates to copper etching and in particular to the selective dissolution of copper. The invention is most concerned with the production of copper circuits by means of alkaline etchants.

In one commonly practiced method of producing printed circuits, copper foil is laminated to an insulating board or base sheet such as plastic or fiber/resin. The foil is next coated with a photosensitive layer and exposed through a negative mask of the circuit thereby forming a protective photoresist in the exposed areas. After removal of the soluble coating in the non-light struck area, the positive copper circuit image is then plated with a solderable protective metal(s), the photoresist removed and the copper background areas dissolved out by etching leaving the metal plated copper circuit bonded to the insulating base. Since it protects the copper from dissolution during the etching operation, the metal coating or plating is referred to as an etching resist but is not to be confused with the photoresist used in forming the copper image.

Etchants commonly used in the production of copper circuits include acidic solutions of metal salts among which cupric chloride, ferric chloride, chromic/sulfuric acid and ammonium and alkali metal peroxydisulfates are familiar examples. In the past few years, however, interest has focused on alkaline etchants since they cause less undercutting than acid etchants. In the etching art the term undercutting refers to removal of material from the side of the circuit relief pattern. The effect is particularly difficult to control when using acid etchants in the production of miniaturized electronic components containing delicate fine line and/or noble metal resisted circuits. In some instances, undercutting results in a weakened circuit structure which may crack or break up with concomitant undesirable electrical performance. Since, as above pointed out, undercutting is less of a problem with alkaline etchants, a great deal of effort is being expended to adopt such etchants to the manufacture of printed circuits. Moreover, acid etchants possess other inherent drawbacks such as corrosiveness and waste disposal problems, attack of solderable metal resists and limited capacity for retaining dissolved metal. As a consequence, special precautions must be taken whereby the acid solutions are monitored and regulated during the etching operation. These undesirable characteristics of acid etchants have further intensified the interest in alkaline etchants, particularly in connection with noble metal resisted circuits.

An example of an alkaline etchant which can be used in the production of copper circuits is described in U.S. Pat. No. 3,231,503 to E. Laue. The etchant of this patent consists essentially of an ammoniacal aqueous solution of sodium chlorite optionally buffered with ammonium carbonate. A modification of the Laue etchant is disclosed to U.S. Pat. No. 3,466,208 to L. J. Slominski. According to this document, replacement of all or part of the ammonium carbonate with ammonium chloride or ammonium nitrate increases etching rate, copper dissolution capacity and stability of the etchant solution. However, even the improved ammoniacal chlorite etchants are not entirely satisfactory because of the difficulty of maintaining uniform and constant etch rates, a necessary requirement in continuous commercial etching operations.

As explained in the aforecited Slominski patent, the etching of copper with ammoniacal chlorite involves three reaction stages as represented by the following equations.

a. $2Cu + NaClO_2 + 4NH_4Cl + 4NH_4OH \rightarrow 2Cu(NH_3)_4Cl_2 + NaCl + 6H_2O$ b. $Cu + Cu(NH_3)_4Cl_2 \rightarrow 2Cu(NH_3)_2Cl$ c. $2Cu(NH_3)_2Cl + \frac{1}{2}O_2 + 2NH_4Cl + 2NH_4OH \rightarrow 2Cu(NH_3)_4Cl_2 + 3H_2O$ The divalent copper in the complex formed according to Equatiion (a) is thus available for further oxidation of metallic copper according to Equation (b) to form the monovalent (cuprous) complex which latter is then oxidized according to (c) by aeration. Conversion of most if not all of the copper to the cupric state, plus increasing concentration of copper in solution to a point where reaction (etching) rates are too slow to be commercially practical, dictate the point at which the solution must be replaced. This corresponds to about 11 ounces of copper without aeration or 14 ounces with aeration. As the primary oxidant is used up, the temperature must be increased up to a maximum of about 55°C.

From the foregoing, it is quite evident that in using ammoniacal chlorite for etching copper, the etchant solution is constantly changing in chemical composition as copper is dissolved and the various oxidative stages come into play. This results in constantly changing etching performance, such as etching speed, requiring extensive attention and monitoring skills to use the etchant solution to produce circuits with desired, uniform qualities. Moreover, as the primary (chlorite) oxidant is depleted, adjustments to increase temperature must be made to take advantage of the secondary (cupric copper) and tertiary (aeration) etching reactions. Yet, the temperature must not be permitted to rise while the sodium chlorite is still present in amounts above about 0.1 mole/liter as this would promote the reaction of sodium chlorite with ammonia to form noxious vapors.

Because they are so difficult to control, the use of ammoniacal chlorite etchants has been limited. What is needed in order to realize the inherent advantages and benefits of such etchants is a means of adapting them to the large scale, continuous manufacture of printed copper circuits.

It has now been discovered that copper can be etched in a continuous process comprising:

a. providing an etchant solution consisting essentially of water, from about 0.001 to 0.1 mole/liter of an alkali metal or ammonium salt of a chloroxy acid, from about 0.4 mole/liter to limit of solubility of cupric amine chloride, an ammonium salt buffer and sufficient ammonia to produce a pH range of about 8–12;

b. contacting a copper coated substrate with said etchant solution for a period sufficient to dissolve the desired amount of copper therefrom;

c. controlling the pH of the etchant by feeding the signal from a pair of electrodes immersed in the etchant solution to a pH meter, the output of which is connected to a voltage sensitive relay which turns on a pump or a valve when the pH falls below a predetermined set point within the pH range thereby introducing ammonia into the etchant until the pH exceeds the predetermined set point at which point the relay turns off the pump or valve;

d. controlling the chloroxy acid salt concentration, by feeding the EMF signal developed between a platinum and a reference electrode in the etchant solution to a voltage sensitive relay which turns on a pump or valve when the EMF falls below a predetermined set point within the range of 50–250 millivolts thereby introducing chloroxy acid salt solution into the etchant until the EMF exceeds the predetermined set point at which time the relay turns off the pump or valve thereby maintaining the etchant in an oxidizing condition and the level of chloroxy acid salt not exceeding about 0.1 mole per liter;

e. retaining the workpiece in the etchant until the copper has been etched out; and f. removing the etched workpiece from the etching solution.

The single FIGURE drawing is a flow diagram of a continuous etch process using the copper etchants of the invention.

The initial cupric amine chloride etchant composition of the invention are conveniently formulated by adding to aqueous ammonia from about 0.4 mole/liter to limit of solubility, preferably about 0.5 to 1.4 mole/liter of cupric chloride and sufficient amounts of an ammonium salt, preferably ammonium chloride as a buffer. The concentration of ammonia and buffer are adjusted to give a pH in the range of 8.0–12.0 preferably 9.0 to 10.0. The aforesaid solution is then activated by adding thereto as an oxidizer for the copper from about 0.001 to 0.1 mole/liter, preferably about 0.01 to 0.05 mole/liter of an alkali metal or ammonium salt of a chloroxy acid such as an alkali metal chlorite preferably sodium chlorite. Other salts of chloroxy acids can be substituted for sodium chlorite and in this concentration reference is made to the alkali metal salts of hypochlorous acid, chloric acid and perchloric acid, the sodium and potassium salts being preferred.

While working with the ammoniacal etchants aforesaid in the production of copper circuits, it was discovered that the EMF developed between a platinum electrode and a reference electrode, such as a calomel electrode or a silver-silver chloride electrode, immersed in the etchant solution is a function of the chloroxy acid salt content and that such relationship could be adapted for controlling and maintaining the concentration of the chloroxy acid salt. Thus far the mechanism of this response of the platinum electrode to the chloroxy acid concentration has not been ascertained.

Chloroxy acid salt concentrations of .001 to .1 mole/liter in the etchant solution result in EMF readings from about 50 to 250 millivolts developed between a platinum electrode and a reference silver-silver chloride electrode immersed in the etchant solution. It was noted that the addition of chloroxy acid salt to the etchant solution did not produce a steady EMF reading within a short time interval, i.e., one to two minutes, indicating that some form of activation or reaction involving chloroxy acid salt occurs in the etchant solution. However, the addition of metallic copper to the resulting etchant solution caused the EMF reading to rapidly decrease. The aforesaid is considered evidence tending to support the indirect role of the chloroxy acid salt in forming the active etching agency in the ammoniacal cupric amine chloride solution. As the upper end of the potential range is reached, the concentration of the chloroxy acid salt approaches about 0.1 mole/liter at which point the EMF levels off at about 250 millivolts and increases only slightly on adding more chloroxy acid salt. The ammoniacal etchants of the invention are desirably operated between an EMF potential of 50 to 250 millivolts between about 85°F and 130° F preferably 100°–120°F while keeping the chloroxy acid salt between about 0.001–0.1 mole/liter. Under these conditions the etchant is maintained in the oxidized state and results in very high and constant etch rates, i.e., about 1.6 mil/minutes. Higher concentrations of oxidant are uneconomical and tend to evolve noxious vapors.

The etchant of the invention is used in the known manner and can be sprayed directly onto the work or contained in baths or tanks where the work is immersed. Such techniques and procedures are spelled out in detail in any number of patents and publications concerned with the production of etched copper circuits.

In a generally preferred modus operandi, the etchants herein are used in a continuous process wherein the etchant is maintained in an oxidizing state by addition of sufficient chloroxy acid salt whereby it does not exceed about 0.1 mole/liter the concentration at which the EMF of the etchant reaches maximum potential of about 250 millivolts. Ammonia is introduced to keep the pH between 9.0 to 10 and sufficient ammonium salt to buffer the ammonia. Since cupric amine chloride is a by-product of the reaction between the copper on the circuit board and the ammoniacal chloroxy acid salt, its concentration in the etchant increases as more copper is dissolved. However, the introduction of fresh chloroxy acid salt and buffer solution displaces a like volume of spent etchant from the etcher so that once established the concentration of cupric amine chloride remains substantially unchanged and can be maintained in the prescribed range of from about 0.4 mole/liter to limit of solubility. Ammonium salts are added to buffer the ammonia and maintain the desired pH range.

In the most preferred embodiment of practicing the invention, etchant is used in a continuous operation wherein electronic controls automatically maintain the etchant components and pH at the optimum levels. In the automatic system, the EMF output from the electrodes in the etchant is connected to a voltage sensitive relay which in turn controls a pump or feed valve for introducing fresh chloroxy and salt and buffer into the etchant tank. When the EMF drops below the set point, the oxidant has fallen below the desired concentration thereby signaling the relay to turn on the pump or open a valve and permit a fresh quantity to flow into the etchant tank. The flow will continue until the EMF exceeds the set point corresponding to the desired chloroxy acid salt concentration. Preferably the EMF set point is adjusted to operate between 50 and 250 millivolts which maintains the chloroxy acid salt between 0.001 to 0.1 mole/liter.

In the absence of oxidizer the EMF reading is about 50 mv. The EMF increases exponentially as the oxidizer concentration increases as follows:

| | | | | | | | |
|---|---|---|---|---|---|---|---|
| $NaClO_2$, mol/liter | 0 | 0.001 | 0.003 | 0.01 | 0.05 | 0.10 | 0.20 |
| EMF (Pt-Ag, AgCl), mv | 50 | 68 | 100 | 150 | 220 | 250 | 280 |

The pH of the etchant solution is preferably maintained at the desired range with automatic ammonia feed. A signal from a pair of electrodes, i.e., glass and reference electrodes in the etchant solution is fed to a pH-meter whose output triggers a voltage sensitive relay which controls a pump, a valve or other devices which feed ammonia gas or aqueous ammonia solution into the etchant.

The machinery for both EMF and pH control is well known in the art and available from suppliers of electronic and engineering components.

Reference is now made to the drawing which shows a flow diagram of the automatic etching process of the invention. Describing the drawing in detail, 1 is an etcher having a sump 4 containing etchant solution. Pump 6 circulates the etchant via line 7 to nozzle 8 from whence the etchant sprays onto the copper work piece 10 and then returns to sump 4. Thermostatically controlled water cooling coil 13 and heater 14 maintains the etchant at the desired preset temperature. 15 is an electrode holder assembly having attached thereto electrodes 18, 19, 20 and 21 which are immersed in the etchant solution. 18 is a reference electrode and 19 a glass electrode. 20 is a reference electrode and 21 is a platinum electrode. Electrodes 20 and 21 are connected to EMF meter 29 via conductors 30 and 30*a*. As the etching proceeds, the quantity of dissolved copper in the etchant builds up resulting in decreased EMF between electrodes 20 and 21. When the EMF drops below a preset value, the voltage sensitive relay 33 is tripped thereby turning on pump 36 which pumps aqueous sodium chlorite etchant via line 37 from storage tank 38 into etcher 1. As the concentration of sodium chlorite in the etcher increases, the EMF between electrodes 20 and 21 rises and when it reaches a preset output, relay 33 opens cutting off current to pump 36 thereby stopping the flow of sodium chlorite solution. Overflow pipe 39 allows excess etchant to be discharged, thus maintaining constant etchant volume in etcher sump 4. The pH of the etchant is detected by electrodes 18 and 19 and the signal transmitted via conductors 24 and 24*a* to pH meter 22. When the pH drops below the desired preset limit, the resulting change in output from pH meter 22 closes relay 40 which opens valve 42 thereby admitting ammonia from tank 45 via line 48 into the etchant. A sparger 50 on the end of line 48 facilitates mixing of the ammonia with etchant. When the pH reaches the upper preset limit, the resulting change in output from pH meter 22 opens relay 40 which closes valve 42 thereby shutting off the flow of ammonia to etchant.

The pH and EMF meters equipped with amplifiers which step up signal output for operating relays are well known devices available from electronic and chemical instrument supply firms.

Reference is now made to the following non-limiting examples.

EXAMPLE 1

An etchant solution was prepared by dissolving into an ammoniacal aqueous solution about 0.5 mole/liter of cupric chloride, about 0.5 mole/liter of ammonium chloride and about 0.25 mole/liter sodium chlorite, which is one of the reaction products when the sodium salt of a chloride containing oxidizer is used, (c.f. equation a supra). About 3 liters of the solution were transferred to the sump of a spray etcher which had a heater and a cooling coil for maintaining the etchant at a constant temperature of 120°F.

The solution in the etcher was continuously recycled with a pump, to an electrode chamber where the oxidizing condition of the solution was measured with a platinum electrode and a silver, silver chloride reference electrode. The pH of the solution was measured with a glass and reference electrode.

The EMF signal was read with an EMF-meter, the output of which, controlled a voltage sensitive relay which in turn controlled the feed pump. When the EMF dropped below 200 mv, indicating that the oxidizer concentration was less than about 0.03 mole, feed solution was introduced at the rate of about 10 ml/min. The addition of feed solution continued until the EMF reached about 200 mv. The feed solution contained 45 g/l of sodium chlorite, and 157 g/l of ammonium chloride.

The pH of the solution was read with a pH-meter; the output of which, controlled a voltage sensitive relay which in turn controlled a solenoid valve. The valve regulated the ammonia gas flow. Ammonia gas was introduced into the etchant through a sparger when the pH went below about 9.5. When the pH reached about 9.5, the valve closed and the gas flow stopped. Excess copper rich spent etchant was removed automatically with a pump.

While the oxidizing condition and the pH of the etchant solution were properly maintained with the automatic controls, continuous etching of copper was carrier out by constantly adding about 30 g/hr., metallic copper, to the etcher. The copper was spray etched at a spray pressure of about 20 psig.

Etching characteristics were determined periodically for the etchant. Copper laminate test panels with a copper thickness of about 1.4 mil (1.4 thousandth of an inch), known in the trade as "1-ounce copper" were used for etch time determinations. Copper laminate test circuits, partially covered with resist, such as gold-nickel or solder were used for etch factor determinations. Etch factor is the index commonly used to rate an etched circuit for the degree of undercutting during etching and is defined as the ratio of vertical etch depth to side attack.

During the 2 hours and 5 minutes continuous etching trial, the etchant solution was found to be stable. No excess gasing or other complications were observed. The EMF and the pH were successfully maintained at the set points throughout the etching trial. It was observed that the etchant etched copper rapidly; the average etch time, the time required for the etchant to etch through 1-ounce copper, was about 53 seconds. All etched tests circuits were cleanly etched and unmottled. Little or no staining was found on the gold-nickel or the solder resist of the circuits. The etch factors obtained averaged 1.11 for gold-nickel, and 2.40 for solder resisted circuits. Etching results are summarized as follows:

| Time | pH | EMF | Etch Time, Sec. |
|---|---|---|---|
| 1:25 | 9.5 | 200 | (start-up) |
| 1:57 | 9.5 | 200 | 64 |
| 2:15 | 9.5 | 200 | 56 |
| 2:31 | 9.5 | 200 | 51 |
| 2:50 | 9.5 | 200 | 48 |
| 3:05 | 9.5 | 200 | 44 |

-Continued

| Time | pH | EMF | | Etch Time, Sec. |
|---|---|---|---|---|
| 3:24 | 9.5 | 200 | | 56 |
| 3:26 | 9.5 | 200 | | 54 |
| 3:29 | 9.5 | 200 | | 54 |
| 3:31 | 9.5 | 200 | | 50 |
| | | | average | 53 |

During the test, about 60 g of copper were dissolved and about 330 ml of the feed solution were used. The chemical utilization, based on the amount of sodium chlorite consumed, is about 288 percent. The apparent greater than 100 percent utilization may be due to air oxidation.

EXAMPLE 2

Another continuous etching trial was carried out similar to that shown in Example 1 except, at this time, the ammoniacal etchant solution contained about 1 mole/liter of cupric amine chloride, about 0.33 mole/liter of ammonium chloride and about 0.5 mole/liter of sodium chlorite. The oxidizing condition of the solution was maintained, automatically, with a feed solution containing about 37 g/l of sodium chlorite and about 123 g/l of ammonium chloride. The pH of the solution was maintained with ammonia gas feed.

During the 1 hour continuous etching run, the average etch time was 52 seconds for 1-ounce copper. The etch factor was about 0.69 to 1.28 for gold-nickel, and about 1.21 to 1.62 for solder resisted circuits.

It was observed that the solution was stable. No difficulties were experienced in maintaining the EMF ahd the pH with the automatic controls. The oxidant utilization with regard to the chlorite was estimated to be 185 percent.

The same rapid copper etching rate was observed for the etchant on the second day when the same EMF and pH were maintained.

EXAMPLE 3

Example 2 was repeated, except a feed solution containing about 18 g/l of sodium chlorate and about 135 g/l of ammonium chloride was used. The EMF was maintained at 170 mv. The average etch time for 1-ounce copper was about 74 seconds. The oxidant utilization was estimated to be greater than 100 percent.

EXAMPLE 4

Example 1 was repeated again with the etchant solution containing 3.2 mole/liter of cupric amine chloride, about 0.5 mole/liter of ammonium chloride and 0.8 mole/liter of sodium chlorite. The feed solution contained about 52 g/l of sodium chlorite and about 331 g/l of ammonium chloride.

The average etch time obtained during the 1 hour and 40 minute continuous etching trial was about 1 minute and 16 seconds. The oxidant utilization was estimated to be 129 percent.

The advantages of the present continuous, instrumentally controlled process of etching copper coated substrates over the prior practices can be summarized as follows:

1. More constant etch rates,
2. More uniform etching characteristics,
3. More efficient oxidant utilization,
4. Ease of waste treatment, and
5. Improved economics.

The significance of these advantages is discussed below.

With respect to 1. more constant etch rates and 2. more uniform etching characteristics, etch rates and etch quality are dependent upon the copper content of the etchant solution, the concentration of oxidant, and the reaction conditions. This process herein provides for continuous operation using instrument control for all reagent and operating conditions. Thus, there will be little variation in any of the critical parameters.

The benefits of constant etch rates and etch quality are:

a. Elimination of the need to change the etching temperature. (In batch processes, the temperature is increased continuously to compensate for the decreasing etching rate as the copper content of the bath increases.)

b. Conveyor speed may now be maintained at a constant rate, which makes the process more acceptable for automation.

c. Intentional over etching may be kept to a minimum.

d. Less rejection of finished product.

3. Oxidation Utilization

The amount of primary oxidant is fed to the system using instrument control. Oxidant is added only when needed and in very low concentrations. Since the oxidant concentration is low, the possibility of secondary reactions e.g., reaction of chlorite with ammonia is slight.

In addition to increased oxidant utilization, the etchant solution itself has an almost infinitely useful life. Usually, baths are discarded when the copper content reaches about 10–11 ounces per gallon. In this process, the etchant of use, is essentially or can be, the so-called "spent" etchant.

4. Waste Disposal

Contrary to the batchwise operation as shown in the prior art, the copper in the effluent will be of the same concentration at all times and all in the +2 oxidation state. This will simplify copper recovery, and make the recovery process more amenable to automation.

5. Economics

Economics are improved by:

1. Increased oxidant utilization,
2. Less rejects,
3. Less downtime (eliminating frequent new bath make-up), and
4. Less direct supervision.

What is claimed is:

1. A method for the selective and continuous dissolution of copper comprising a. providing an etchant solution consisting essentially of water, from about 0.001 to 0.1 mole/liter of an alkali metal or ammonium salt of a chloroxy acid, from about 0.4 mole/liter to limit of solubility of cupric amine chloride, an ammonium salt buffer and sufficient ammonia to produce a pH range of about 8–12;

b. contacting a copper coated substrate with said etchant solution for a period sufficient to dissolve the desired amount of copper therefrom;

c. controlling the pH of the etchant by feeding the signal from a pair of electrodes immersed in the etchant solution to a pH meter, the output of which is connected to a voltage sensitive relay which turns on a pump or a valve when the pH falls below a predetermined set point within the pH range thereby introducing ammonia into the etchant until the pH exceeds the predetermined set point at which point the relay turns off the pump or valve;

d. controlling the chloroxy acid salt concentration, by feeding the EMF signal developed between a platinum and a reference electrode in the etchant solution to a voltage sensitive relay which turns on a pump or valve when the EMF falls below a predetermined set point within the range of 50–250 millivolts thereby introducing chloroxy acid salt solution into the etchant until the EMF exceeds the predetermined set point at which time the relay turns off the pump or valve thereby maintaining the etchant in an oxidizing condition and the level of chloroxy acid salt not exceeding about 0.1 moles per liter;

e. retaining the workpiece in the etchant until the copper has been etched out; and f. removing the etched workpiece from the etching solution.

2. The method according to claim 1 wherein the copper coated substrate is a copper circuit board.

3. The method according to claim 1 wherein the chloroxy acid salt is sodium chlorite.

4. The method according to claim 1 wherein the ammonium salt buffer is ammonium chloride.

* * * * *